United States Patent
Kishi (10) Patent No.: US 7,539,036 B2
(45) Date of Patent: May 26, 2009

(54) SEMICONDUCTOR MEMORY DEVICE INCLUDING PLURALITY OF MEMORY MATS

(75) Inventor: Koji Kishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/699,386

(22) Filed: Jan. 30, 2007

(65) Prior Publication Data

US 2007/0183239 A1    Aug. 9, 2007

(30) Foreign Application Priority Data

Jan. 30, 2006    (JP) ............... 2006-021010

(51) Int. Cl.
 G11C 5/06    (2006.01)
 G11C 5/02    (2006.01)
 G11C 16/04    (2006.01)
 G11C 8/00    (2006.01)

(52) U.S. Cl. ............ 365/63; 365/51; 365/185.13; 365/230.03

(58) Field of Classification Search ............ 365/185.21, 365/63
See application file for complete search history.

(56) References Cited

U.S. PATENT DOCUMENTS

| | | | | |
|---|---|---|---|---|
| 4,694,427 A | * | 9/1987 | Miyamoto et al. | 365/185.23 |
| 4,819,213 A | * | 4/1989 | Yamaguchi et al. | 365/233.1 |
| 4,937,788 A | * | 6/1990 | Harada | 365/189.04 |
| 5,022,009 A | * | 6/1991 | Terada et al. | 365/185.21 |
| 5,652,719 A | * | 7/1997 | Tanaka et al. | 365/185.03 |
| 5,761,124 A | * | 6/1998 | Sato et al. | 365/185.21 |
| 5,978,271 A | * | 11/1999 | Sato et al. | 365/185.21 |
| 6,154,403 A | * | 11/2000 | Tanzawa et al. | 365/203 |
| 6,198,682 B1 | * | 3/2001 | Proebsting | 365/207 |
| 6,208,560 B1 | * | 3/2001 | Tanaka et al. | 365/185.22 |
| 6,580,655 B2 | * | 6/2003 | Jacunski et al. | 365/230.03 |
| 2002/0186590 A1 | * | 12/2002 | Lee | 365/185.17 |
| 2003/0103368 A1 | * | 6/2003 | Arimoto et al. | 365/63 |
| 2004/0145959 A1 | * | 7/2004 | Kuge et al. | 365/230.03 |
| 2005/0057963 A1 | * | 3/2005 | Ogura et al. | 365/155 |
| 2005/0117429 A1 | * | 6/2005 | Lin | 365/222 |
| 2007/0121376 A1 | * | 5/2007 | Toda | 365/185.2 |

FOREIGN PATENT DOCUMENTS

| | | |
|---|---|---|
| JP | 6-103789 A | 4/1994 |
| JP | 8-147990 A | 6/1996 |
| JP | 8-235878 A | 9/1996 |
| JP | 2004-318941 A | 11/2004 |

* cited by examiner

*Primary Examiner*—Son L Mai
(74) *Attorney, Agent, or Firm*—McDermott Will & Emery LLP (57) ABSTRACT

A semiconductor memory device includes a plurality of memory mats each including a memory cell storing data, a sense latch portion performing detection of data stored by the memory cell, and a buffer circuit externally outputting read data detected by the sense latch portion. The sense latch portion and the buffer circuit are shared between a plurality of memory mats and are arranged between a plurality of memory mats.

6 Claims, 7 Drawing Sheets

SEMICONDUCTOR MEMORY DEVICE INCLUDING PLURALITY OF MEMORY MATS

BACKGROUND OF THE INVENTION

1. Field of the Invention

The present invention relates to a semiconductor memory device, and more particularly to a semiconductor memory device including a plurality of memory cells divided and arranged in a plurality of memory mats.

2. Description of the Background Art

Semiconductor memory devices, for example, flash memories have been developed in which information can be stored by injecting electrons into or removing electrons from a floating gate (FG). A flash memory includes a memory cell having a floating gate, a control gate (CG), a source, a drain, and a well (substrate). In a memory cell, a threshold voltage is raised when electrons are injected into the floating gate, and the threshold voltage is lowered when electrons are removed from the floating gate. In general, the distribution of the lowest threshold voltage is called an erasure state of a memory cell, and the distribution of the threshold voltage higher than that of the erasure state is called a writing state of a memory cell. For example, when a memory cell stores two-bit data, the threshold voltage distribution of the lowest voltage corresponds to a logic level "11", and this state is called an erasure state. Then, a writing operation is performed on a memory cell to drive the threshold voltage higher than that of the erasure state thereby achieving the threshold voltages corresponding to logic levels "10", "01" and "00", and this state is called a writing state. Furthermore, in a semiconductor memory device, for example, data write and data read are performed on a memory cell by charging/discharging a voltage supply line such as a bit line connected to the memory cell.

Here, in recent years, the area of a memory mat having memory cells arranged therein becomes larger with the increased memory capacity, and the length of a bit line connected to a memory cell is increased. With the increased length of a bit line, the wiring capacitance is increased so that it takes long time to charge/discharge the bit line. Therefore, the data read time and the data write time for a memory cell are inevitably increased.

In order to solve such a problem, for example, Japanese Patent Laying-Open No. 06-103789 (Patent Document 1) discloses a semiconductor memory device as follows. Specifically, a memory array is divided in two, and a sense amplifier is provided between the memory arrays. Such a configuration prevents the increased bit line length and thus the increased wiring capacitance.

Now, the sense amplifier detecting data stored in a memory cell is usually connected to an input/output circuit for outputting read data to the outside and inputting write data from the outside. Here, when the interconnection line between the sense amplifier and the input/output circuit is long, the data read time is increased because of a large wiring capacitance. Especially in a semiconductor memory device having a memory cell storing multi-bit data, the number of times of data transfers between the sense amplifier and the input/output circuit is large, so that the increase in data read time is outstanding.

However, in semiconductor memory devices according to Patent Document 1 and Japanese Patent Laying-Open Nos. 08-235878, 2004-318941 and 08-147990 (Patent Documents 2-4), no measures are taken against the increase in data read time resulting from the data transfers between the sense amplifier and the input/output circuit.

SUMMARY OF THE INVENTION

An object of the present invention is therefore to provide a semiconductor memory device in which an increase in access time, for example, data reading, to the semiconductor memory device can be prevented.

A semiconductor memory device in accordance with an aspect of the present invention includes: a plurality of memory mats each including a memory cell storing data; a sense amplifier performing detection of data stored by each memory cell; and a buffer circuit externally outputting read data detected by the sense amplifier. The sense amplifier and the buffer circuit are shared between the plurality of memory mats and are arranged between the plurality of memory mats.

A semiconductor memory device in accordance with another aspect of the present invention includes: a first memory mat and a second memory mat each including a memory cell storing data; at least one first current line arranged for each of the memory mats and connected to one conductive electrode of the memory cell; a sense latch shared between the memory mats for storing electric charges corresponding to write data for the memory cell in said first current line and detecting data stored by the memory cell based on a voltage value or a current value of the first current line; at least one second current line arranged for each of the memory Mats; a plurality of first transistors arranged corresponding to the first current line for switching between connection and disconnection between the first current line and the second current line; a plurality of second transistors arranged corresponding to the first current line for switching between connection and disconnection between the first current line and the sense latch; at least one third current line arranged for each of the memory mats; and a plurality of third transistors arranged corresponding to the first current line for switching between connection and disconnection between the other conductive electrode of the memory cell and the third current line.

In accordance with the present invention, it is possible to prevent an increase in access time to the semiconductor memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described with reference to the figures. It is noted that in the figure the same or corresponding parts will be denoted with the same reference characters and description thereof will not be repeated.

First Embodiment

Figure 1:
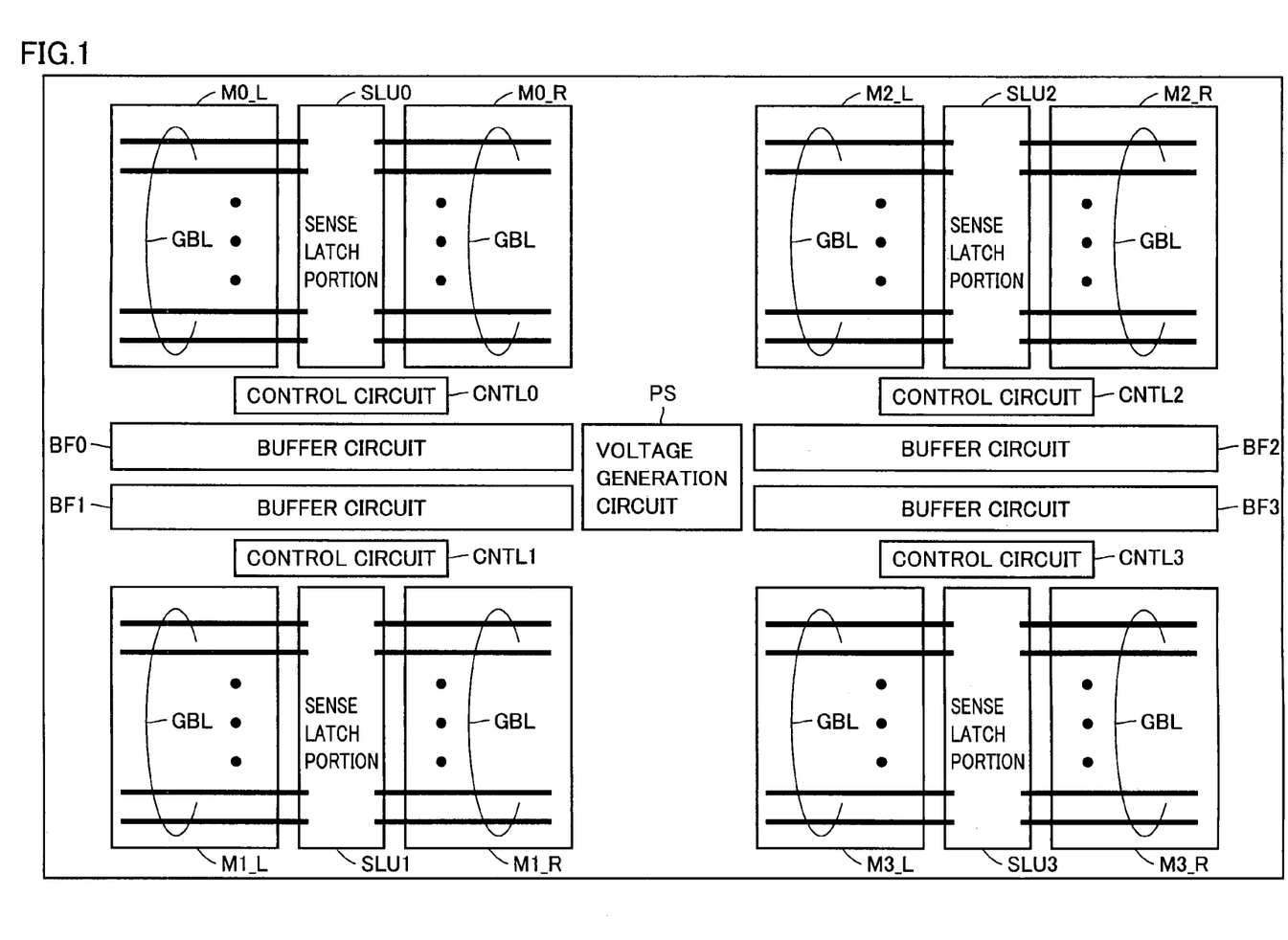
FIG. 1 is a diagram schematically showing a configuration of a semiconductor memory device in accordance with a first embodiment of the present invention.

FIG. 1 is a diagram schematically showing a configuration of a semiconductor memory device in accordance with a first embodiment of the present invention.

Referring to the figure, the semiconductor memory device includes a plurality of memory cells storing data, memory mats M0_L-M3_L, memory mats M0_R-M3_R, sense latch portions SLU0-SLU3, buffer circuits (input/output circuits) BF0-BF3, a voltage generation circuit PS, and control circuits CNTL0-CNTL3.

A plurality of memory cells in the semiconductor memory device are divided and arranged in memory mats M0_L-M3_L and memory mats M0_R-M3_R.

Memory mats M0_L-M3_L are arranged on the left side of sense latch portions SLU0-SLU3. Memory mats M0_R-M3_R are arranged on the right side of sense latch portions SLU0-SLU3. In other words, sense latch portions SLU0-SLU3 are arranged between the memory mats.

The buffer circuit is, for example, an SRAM (Static Random Access Memory) for performing an output of read data to the outside of the semiconductor memory device and an input of write data from the outside of the semiconductor memory device.

Sense latch portions SLU0-SLU3 include sense latches SL arranged corresponding to global bit lines (current lines) GBL. Global bit line GBL is connected to a memory cell in the memory mat. Sense latch SL includes a not shown latch circuit and sense amplifier for performing detection of read data and temporary storage of write data and read data.

More specifically, the latch circuit in sense latch SL temporarily stores write data received from buffer circuit BF. Then, sense latch SL stores in global bit line GBL electric charges corresponding to the logic level of write data temporarily stored in the latch circuit.

On the other hand, the sense amplifier in sense latch SL performs detection of data stored in a memory cell by detecting a voltage value in global bit line GBL. The latch circuit in sense latch SL temporarily stores the detected data and outputs the temporarily stored data to buffer circuit BF. Because of such a configuration, even when buffer circuit BF cannot externally output the read data detected by each sense amplifier at a time, buffer circuit BF can take out and externally output the read data from each latch circuit one by one.

It is noted that the sense amplifier in sense latch SL may be configured to perform detection of data stored in a memory cell by detecting current flowing in global bit line GBL.

Voltage generation circuit PS supplies voltage to each memory mat and each sense latch portion through each voltage supply line as described later.

Control circuits CNTL0-CNTL3 supply voltage to the respective corresponding memory mats and sense latch portions by controlling voltage generation circuit PS.

Figure 2:
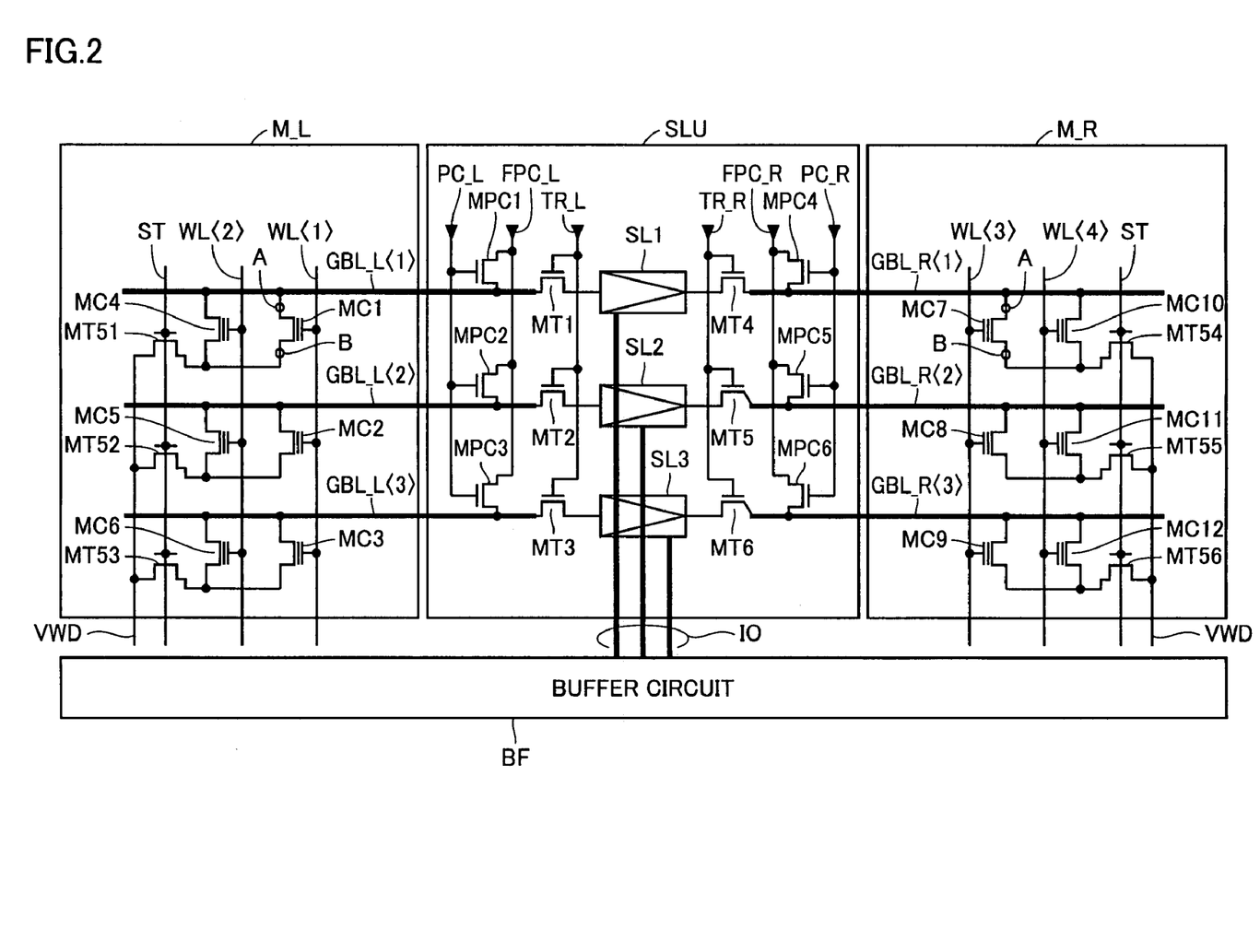
FIG. 2 is a diagram showing a configuration of a sense latch portion and a memory mat in the semiconductor memory device in accordance with the first embodiment of the present invention.

FIG. 2 is a diagram showing a sense latch portion and a memory mat in the semiconductor memory device in accordance with the first embodiment of the present invention.

Referring to the figure, sense latch portion SLU includes precharge/discharge MOS (Metal Oxide Semiconductor) transistors (first transistors) MPC1-MPC6, transfer MOS transistors (second transistors) MT1-MT6, and sense latches SL1-SL3. Memory mat M_L includes memory cells MC1-MC6 and transfer MOS transistors (third transistors) MT51-MT53. Memory mat M_R includes memory cells MC7-MC12 and transfer MOS transistors (third transistors) MT54-MT56.

The connection relationship between the transistors arranged on the left side of sense latches SL1-SL3 will be described. Transfer MOS transistors MT1-MT3 have their sources connected to sense latches SL1-SL3, their gates connected to a voltage supply line TR_L and their drains connected to global bit lines GBL_L<1>-GBL_L<3>. Precharge/discharge MOS transistors MPC1-MPC3 have their sources connected to a voltage supply line FPC_L, their gates connected to a voltage supply line PC_L and their drains connected to global bit lines GBL_L<1>-GBL_L<3>.

The connection relationship between the transistors arranged on the right side of sense latches SL1-SL3 will now be described. Transfer MOS transistor MT4-MT6 have their sources connected to sense latches SL1-SL3 respectively, their gates connected to a voltage supply line TR_R and their drains connected to global bit lines GBL_R<1>-GBL_R<3> respectively. Precharge/discharge MOS transistors MPC4-MPC6 have their sources connected to a voltage supply line FPC_R, their gates connected to a voltage supply line PC_R and their drains connected to global bit lines GBL_R<1>-GBL_R<3> respectively.

The connection relationship in memory mat M_L will now be described. Memory cells MC1-MC3 have terminals (conductive electrode) A connected to global bit lines GBL_L<1>-GBL_L<3> respectively, the gates connected to a word line (voltage supply line) WL<1> and terminals (conductive electrode) B connected to the drains of transfer MOS transistors MT51-MT53 respectively. Memory cells MC4-MC6 have terminals A connected to global bit lines GBL_L<1>-GBL_L<3> respectively, the gates connected to a word line WL<2> and terminals B connected to the drains of transfer MOS transistors MT51-MT53 respectively. Transfer MOS transistors MT51-MT53 have the gates connected to a voltage supply line ST and the sources connected to a voltage supply line VWD. The connection relationship in memory mat M_R is similar to that of memory mat M_L and therefore detailed description thereof will not be repeated here.

Figure 3:
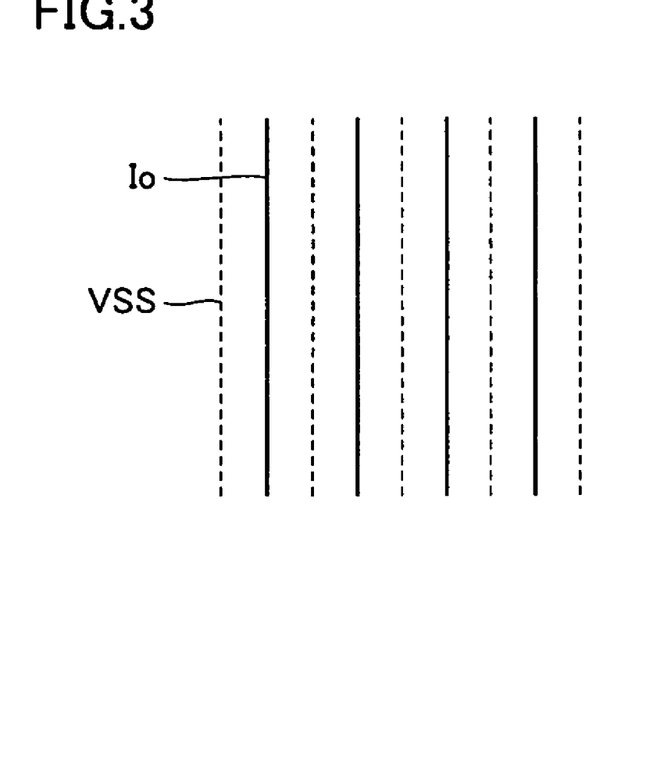
FIG. 3 is a diagram showing an interconnection line between a sense latch and a buffer circuit.

FIG. 3 is a diagram showing an interconnection line between a sense latch and a buffer circuit. Referring to the figure, shield wires at a ground voltage VSS extend approximately parallel to each other on opposite sides of an interconnection line IO between sense latch SL and buffer circuit BF. In other words, interconnection lines IO and the shield wires at ground voltage VSS extend alternately. Such a configuration can prevent interference between interconnection lines.

Figure 4:
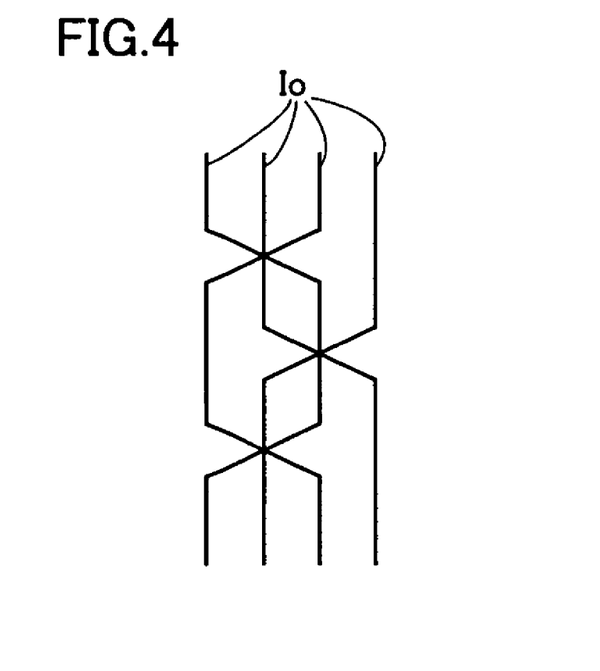
FIG. 4 is a diagram showing another example of an interconnection line between a sense latch and a buffer circuit.

FIG. 4 is a diagram showing another example of an interconnection line between a sense latch and a buffer circuit. Referring to the figure, interconnection line IO between sense latch SL and buffer circuit BF is formed as a twisted wire thereby preventing interference between interconnection lines.

It is noted that the interconnection line between sense latch SL and buffer circuit BF may be formed by combining a shield wire at the ground voltage and a twisted wire as appropriate.

[Data Reading Operation]

The operation of the semiconductor memory device in accordance with the first embodiment of the present invention in performing data read and data write for a memory cell will be now be described.

Here, data read and data write for memory cells MC1-MC3 corresponding to word line WL<1> of memory mat M_L will be described.

In data reading, a voltage corresponding to read data is applied to word line WL<1>, and a low voltage, for example, −2V for suppressing leak current in memory cells MC4-MC6 is applied to word line WL<2>. In addition, for example, a voltage of 3.5V is applied to voltage supply line TR_L, the ground voltage is applied to voltage supply line PC_L, a voltage of 1.8V is applied to voltage supply line FPC_L, and the ground voltage is applied to voltage supply line ST and voltage supply line VWD. Here, transfer MOS transistors MT1-MT3 turn on, precharge/discharge MOS transistors MPC1-MPC3 turn off, a memory cell having a threshold voltage lower than the voltage applied to word line WL<1>, of memory cells MC1-MC3, turn on, memory cells MC4-MC6 turn off, and transfer MOS transistors MT51-MT53 turn off.

Then, for example, a voltage of 2V is applied to voltage supply line PC_L, and precharge/discharge MOS transistors MPC1-MPC3 turn on. Then, global bit lines GBL_L<1>-GBL_L<3> are precharged to a voltage smaller than the gate voltage 2V of precharge/discharge MOS transistors MPC1-MPC3 by a threshold voltage. In other words, electric charges are accumulated in global bit lines GBL_L<1>-GBL_L<3>.

Then, for example, a voltage of 8V is applied to voltage supply line ST, and transfer MOS transistors MT51-MT53 turn on. Then, electric charges accumulated in global bit line GBL_L connected to memory cell MC in the on-state, of global bit lines GBL_L<1>-GBL_L<3>, are discharged, that is, flow between terminal A and terminal B of memory cell MC in the on-state to flow into voltage supply line VWD. When the electric charges precharged in global bit lines GBL_L<1>-GBL_L<3> are discharged, the voltage in global bit lines GBL_L<1>-GBL_L<3> changes. Then, sense latches SL1-SL3 detect the logic level of the data stored in memory cells MC1-MC3 based on the voltage variation in global bit lines GBL_L<1>-GBL_L<3> for output to buffer circuit BF.

It is noted that in the case where a memory cell stores multi-bit data, in data reading, after global bit line GBL is precharged and the voltage variation is detected, precharge/discharge MOS supplies the ground voltage to voltage supply line FPC_L to discharge and then precharge again global bit line GBL. Because of such a configuration, even when a plurality of voltages are continuously applied to word line WL for reading multi-bit data from a memory cell, the voltage variation in global bit line GBL corresponding to the threshold voltage of the memory cell can be detected accurately.

[Data Writing Operation]

In data writing, buffer circuit BF outputs write data received from the outside of the semiconductor memory device to sense latch SL. Then, for example, a voltage of 3.5V is applied to voltage supply line TR_L. For example, a voltage of the ground voltage is applied from sense latch SL to global bit line GBL_L corresponding to memory cell MC to be written, and, for example, a voltage of 4.5V is applied from sense latch SL to global bit line GBL_L corresponding to memory cell MC not to be written.

Then, for example, a voltage of 8V is applied to voltage supply line ST, a voltage of 4.5V is applied to voltage supply line VWD, and transfer MOS transistors MT51-MT53 turn on. Then, the voltage at terminals B of memory cells MC1-MC6 becomes 4.5V. Furthermore, a voltage greater than the threshold voltage of memory cell MC is applied to word line WL<1>, and a low voltage, for example, −2V for suppressing leak current in memory cells MC4-MC6 is applied to word line WL<2>. Here, in word line WL<1>, since the voltage at terminal A of memory cell MC to be written is 0V and the voltage at terminal A of memory cell MC not to be written is 4.5V, electric charges flow between terminal A and terminal B of memory cell MC to be written. Data writing is thus performed.

Therefore, in the semiconductor memory device in accordance with the first embodiment of the present invention, control of voltage supply and the like can be performed independently for each memory mat and transistor corresponding to a memory cell to/from data is read or written, so that the amount of electric charges for charging/discharging the global bit line can be reduced thereby reducing the power consumption of the semiconductor memory device.

Description will now be made to parallel data reading and parallel data writing, more specifically to the case where data read and data write are performed for the memory cells in both memory mat M_L and memory mat M_R. The details of the data reading and data writing operations for a memory cell are similar to the foregoing description and therefore detailed description thereof will not be repeated here.

[Parallel Data Reading Operation]

In parallel data reading, control circuit CNTL controls voltage generation circuit PS to turn on precharge/discharge MOS transistors MPC1-MPC6 and prechrage global bit lines GBL_L<1>-GBL_L<3> and GBL_R<1>-GBL_R<3>. Then, control circuit CNTL turns on transfer MOS transistors MT51-MT56 and discharge global bit lines GBL_L<1>-GBL_L<3> and GBL_R<1>-GBL_R<3>.

Then, control circuit CNTL turns on transfer MOS transistors MT1-MT3 corresponding to memory mat M_L and turns off transfer MOS transistors MT4-MT6 corresponding to memory mat M_R thereby detecting data stored in memory cell MC based on the voltage variation in global bit line GBL connected to memory cell MC of memory mat M_L. Then, control circuit CNTL turns off transfer MOS transistors MT1-MT3 corresponding to memory mat M_L and turns on transfer MOS transistors MT4-MT6 corresponding to memory mat M_R thereby detecting data stored in memory cell MC based on the voltage variation in global bit line GBL connected to memory cell MC of memory mat M_R.

[Parallel Data Writing]

In parallel data writing, buffer circuit BF outputs to sense latch SL write data for memory cell MC of memory mat M_L, which is received from the outside of the semiconductor memory device. Then, control circuit CNTL controls voltage generation circuit PS to turn on transfer MOS transistors MT1-MT3, turn off transfer MOS transistors MT4-MT6, and turn on precharge/discharge MOS transistors MPC1-MPC3. Sense latch SL charges electric charges corresponding to write data into global bit lines GBL_L<1>-GBL_L<3> through transfer MOS transistors MT1-MT3.

Then, buffer circuit BF outputs to sense latch SL write data for memory cell MC of memory mat M_R, which is received from the outside of the semiconductor memory device. Then, control circuit CNTL turns off transfer MOS transistors MT1-MT3, turns on transfer MOS transistors MT4-MT6, and turns on precharge/discharge MOS transistors MPC4-MPC6. Sense latch SL charges electric charges corresponding to write data into global bit lines GBL_R<1>-GBL_R<3> through transfer MOS transistors MT4-MT6. Then, control circuit CNTL turns on transfer MOS transistors MT51-MT56 corresponding to memory mat M_L and memory mat M_R to feed electric charges between terminals A and terminals B of memory cells MC of memory mat M_L and memory mat M_R.

Therefore, in the semiconductor memory device in accordance with the first embodiment of the present invention, data read and data write for memory cells MC in both memory mat M_L and memory mat M_R can be performed efficiently thereby preventing an increase in access time to the semiconductor memory device.

It is noted that in parallel data reading and parallel data writing, the order of data reading and data writing for memory mat M_L and memory mat M_R can be reversed.

[Layout]

Figure 5:
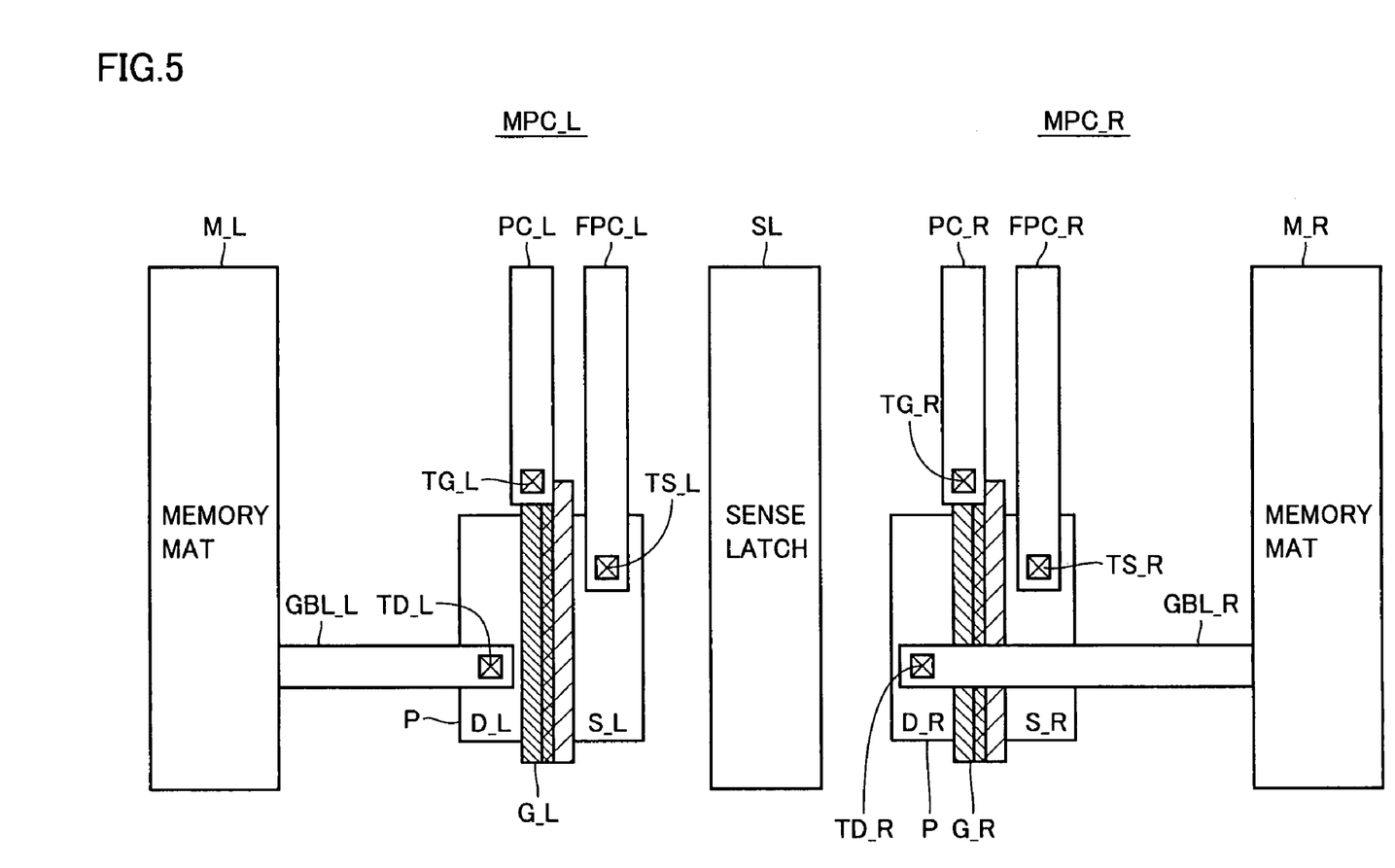
FIG. 5 is a diagram showing a layout of a precharge/discharge MOS transistor in the semiconductor memory device in accordance with the first embodiment of the present invention.

FIG. 5 is a diagram showing a layout of a precharge/discharge MOS transistor in the semiconductor memory device in accordance with the first embodiment of the present invention.

Referring to the figure, precharge/discharge MOS transistor MPC_L corresponds to precharge/discharge MOS transistors MPC1-MPC3, and precharge/discharge MOS transistor MPC_R corresponds to precharge/discharge MOS transistors MPC4-MPC6.

Precharge/discharge MOS transistors MPC_L and MPC_R each have a drain (conductive electrode) region, a gate (control electrode) region and a source (conductive electrode) region successively formed in the direction in which global bit line GBL extends. The drain region and the source region are formed in a diffusion layer P of the substrate of the semiconductor memory device and the gate region is formed on the diffusion layer P.

In precharge/discharge MOS transistor MPC_L, contacts TD_L, TG_L and TS_L are formed in drain region D_L, gate region G_L and source region S_L, respectively. Drain region D_L is connected to global bit line GBL_L through contact TD_L, gate region G_L is connected to voltage supply line PC_L through contact TG_L, and source region S_L is connected to voltage supply line FPC_L through contact TS_L. The connection relationship of each region and contact of precharge/discharge MOS transistor MPC_R is similar to that of precharge/discharge MOS transistor MPC_L and therefore description thereof will not be repeated here.

Drain region D_L of precharge/discharge MOS transistor MPC_L is arranged on the memory mat M_L side and source region S_R of precharge/discharge MOS transistor MPC_R is arranged on the memory mat M_R side.

More specifically, memory mat M_L, drain region D_L, gate region G_L and source region S_L of precharge/discharge MOS transistor MPC_L, sense latch SL, drain region D_R, gate region G_R and source region S_R of precharge/discharge MOS transistor MPC_P, and memory mat M_R are arranged in that order in the direction in which global bit line GBL extends.

Here, gate region G_L and gate region G_R may be displaced to the hatched region shown by oblique lines from bottom left to right top in the figure, due to misalignment, so that the positional relation between the diffusion layer and the gate region may become different from the desired layout. In this case, for example, the area of drain region D_L of precharge/discharge MOS transistor MPC_L is increased, and the area of the precharged region, that is, the area of the drain region and global bit line GBL is increased. As a result, the characteristics such as the threshold value of memory cell MC in memory mat M_L are changed.

However, in the semiconductor memory device in accordance with the first embodiment of the present invention, as shown in the figure, the area of drain region D_R of precharge/discharge MOS transistor MPC_R is increased similarly to drain region D_L even in the event of misalignment, so that it is possible to prevent variations in characteristics such as the threshold value of memory cells MC in memory mat M_L and memory mat M_R.

[Modified Layout]

Figure 6:
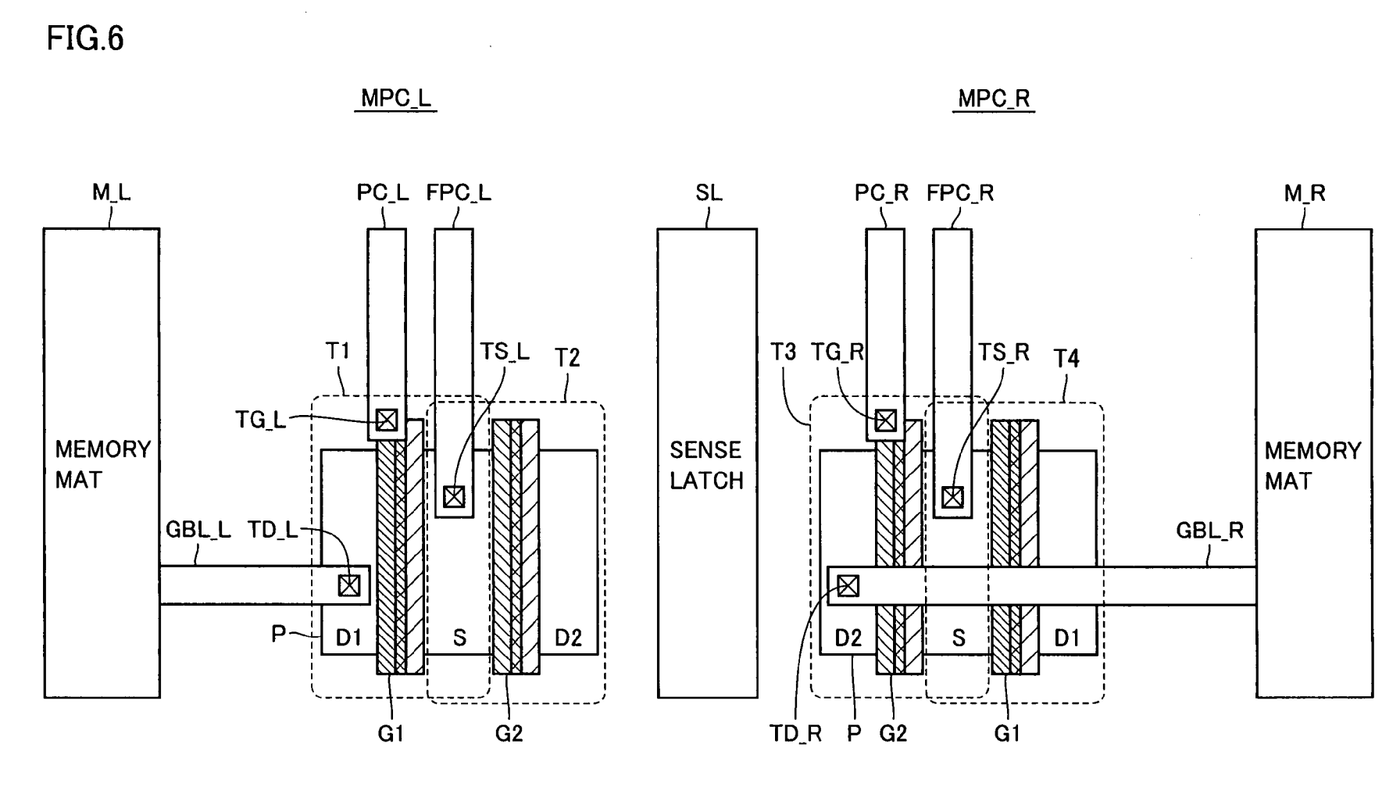
FIG. 6 is a diagram showing a modified layout of a precharge/discharge MOS transistor in the semiconductor memory device in accordance with the first embodiment of the present invention.

FIG. 6 is a diagram showing a modified layout of a precharge/discharge MOS transistor in the semiconductor memory device in accordance with the first embodiment of the present invention.

Referring to the figure, an MOS transistor (fourth transistor) T1 and an MOS transistor (fifth transistor) T2 are arranged in the direction in which global bit line GBL extends between sense latch SL and memory mat M_L. In addition, an MOS transistor (sixth transistor) T3 and an MOS transistor (seventh transistor) T4 are formed in the direction in which global bit line GBR extends between sense latch SL and memory mat M_R. Source region S of MOS transistor T1 and MOS transistor T2 is formed in common in diffusion layer P. Source region S of MOS transistors T3 and T4 is formed in common in diffusion layer P.

More specifically, memory mat M_L, drain region D1 and gate region G1 of MOS transistor T1, source region S of MOS transistor T1 and MOS transistor T2, gate region G2 and drain region D2 of MOS transistor T2, sense latch SL, drain region D2 and gate region G2 of MOS transistor T3, source region S of MOS transistor T3 and MOS transistor T4, gate region G1 and drain region D1 of MOS transistor T4, and memory mat M_R are arranged in that order in the direction in which global bit line GBL extends.

Of MOS transistor T1 and MOS transistor T2 arranged between sense latch SL and memory mat M_L, MOS transistor T1 which is close to memory mat M_L has drain region D1 connected to global bit line GBL_L and has gate region G1 connected to voltage supply line PC_L. In other words, MOS transistor T1 close to memory mat M_L is used as a precharge/discharge MOS transistor.

Of MOS transistors T3 and T4 arranged between sense latch SL and memory mat M_R, MOS transistor T3 which is far from memory mat M_R has drain region D2 connected to global bit line GBL_R and has gate region G2 connected to voltage supply line PC_R. In other words, MOS transistor T3 far from memory mat M_R is used as a precharge/discharge MOS transistor.

Therefore, in the configuration shown in FIG. 6, similar to the configuration shown in FIG. 5, the areas of drain region D_L and drain region D_R are similarly increased even in the event of misalignment, so that it is possible to prevent variations in characteristics such as the threshold value of memory cells MC in memory mat M_L and memory mat M_R.

Furthermore, as in the semiconductor memory device in accordance with the first embodiment of the present invention, in the configuration having precharge/discharge MOS transistors MPC arranged on opposite sides of sense latch SL, the precharge/discharge MOS transistors MPC are preferably arranged symmetrically with respect to the sense latch for a simple layout design of a semiconductor memory device.

Here, the drain region and the source region of precharge/discharge MOS transistor MPC may be different in configuration. For example, the distance between the gate region and the source region may be different from the distance between the gate region and the drain region in order to supply a high voltage to the drain region or the source region. Furthermore, in precharge/discharge MOS transistor MPC, the connection relationship between the drain region and the peripheral region and the connection relationship between the source region and the peripheral region may be different and the number of contacts and the like may be different between the drain region and the source region.

In the configuration shown in FIG. 5, the symmetric arrangement of precharge/discharge MOS transistors MPC_L and MPC_R with respect to the sense latch cannot be adapted to the case where the drain region and the source region are different in structure, because the region that is used as a drain region in precharge/discharge MOS transistor MPC_L comes to be used as a source region in precharge/discharge MOS transistor MPC_R.

In the configuration shown in FIG. 6, however, even the symmetric arrangement of precharge/discharge MOS transistor MPC_L and MPC_R with respect to the sense latch can be adapted to the case where the drain region and the source region are different in structure, because the region that is used as a source region in precharge/discharge MOS transistor MPC_L is used as a source region also in precharge/discharge MOS transistor MPC_R and drain region D2 that is not used in precharge/discharge MOS transistor MPC_L is used in precharge/discharge MOS transistor MPC_R. Therefore, in the configuration shown in FIG. 6, it is possible to simplify the layout design of the semiconductor memory device, as compared with the configuration shown in FIG. 5.

In addition, in the semiconductor memory device in accordance with the first embodiment of the present invention, sense latch SL is shared between memory mat M_L and memory mat M_R and is arranged between memory mat M_L and memory mat M_R. Such a configuration can achieve a reduced length of the global bit line and can prevent an increase in data read time and data write time for a memory cell. Moreover, the reduced length of the global bit line can reduce the amount of electric charges for charging and discharging the global bit line and can prevent variations of the threshold voltage of the memory cell in data writing.

Another embodiment of the present invention will now be described with reference to the figures. It is noted that the same or corresponding parts in the figures will be denoted with the same reference characters and description thereof will not be repeated.

Second Embodiment

The present embodiment relates to a semiconductor memory device with a changed arrangement of the buffer circuit. Except the following description, the configuration and operation is similar to that of the semiconductor memory device in accordance with the first embodiment.

Figure 7:
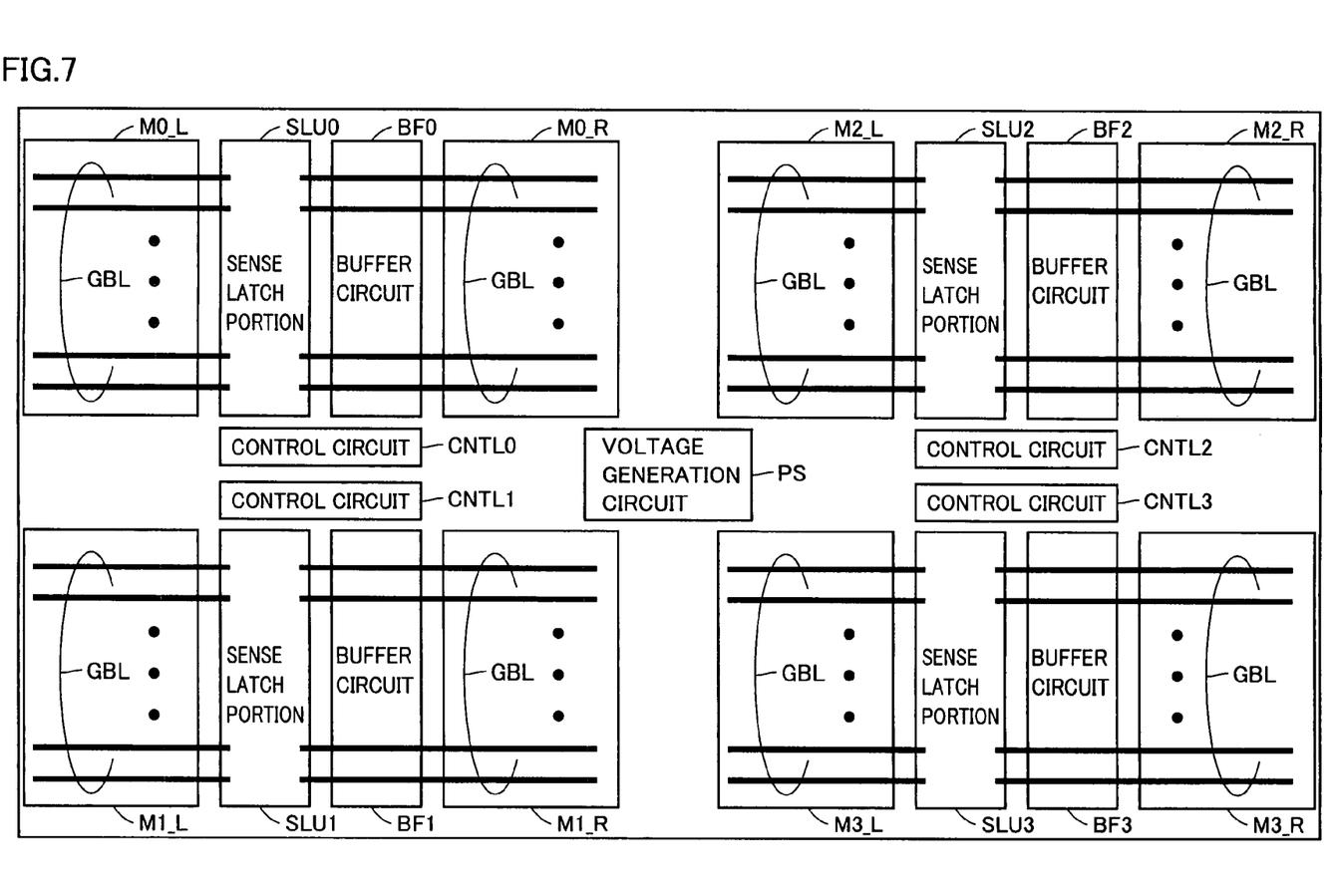
FIG. 7 is a diagram schematically showing a configuration of a semiconductor memory device in accordance with a second embodiment of the present invention.
Figure 8:
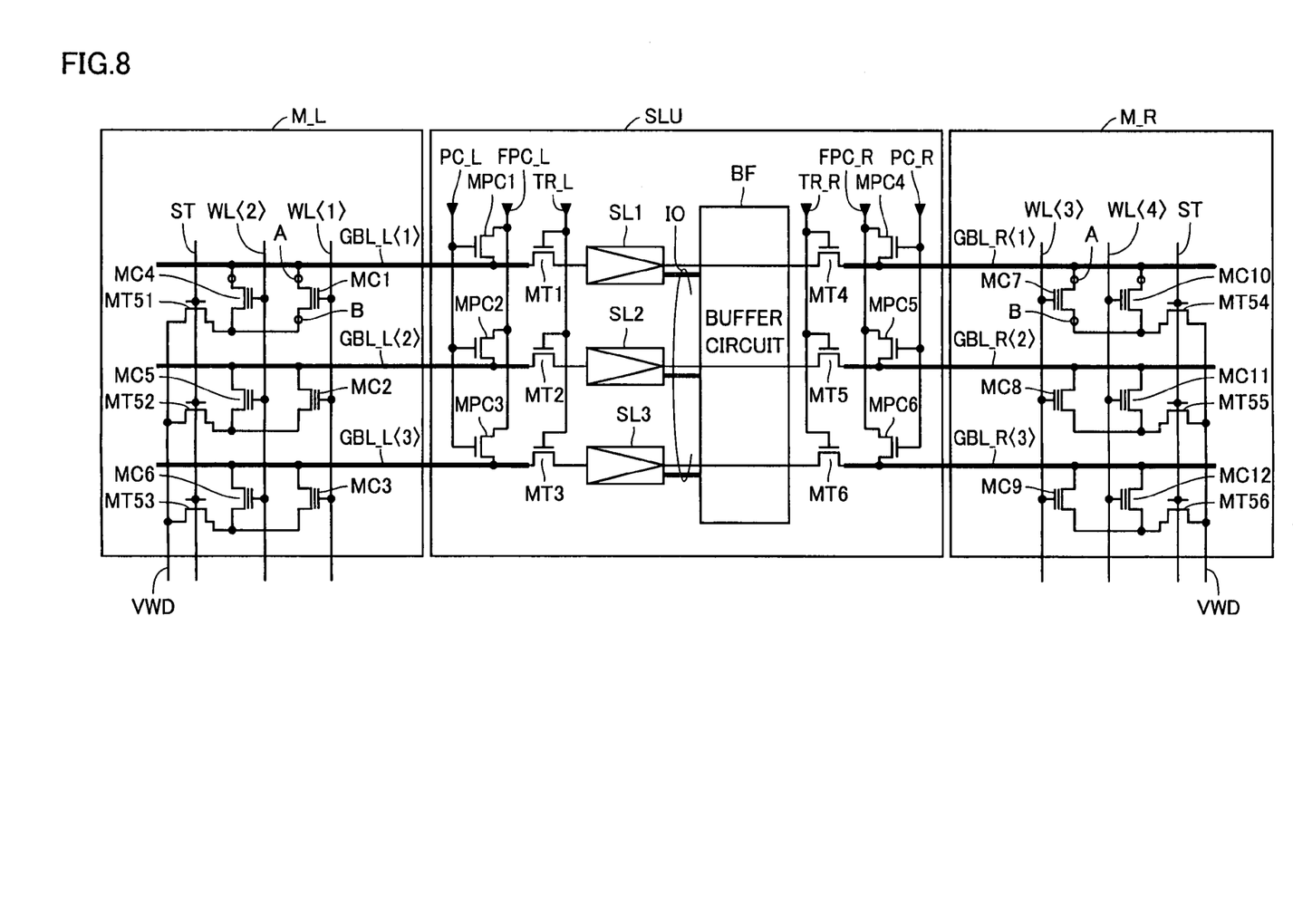
FIG. 8 is a diagram showing a configuration of a sense latch portion and a memory mat in the semiconductor memory device in accordance with the second embodiment of the present invention.

FIG. 7 is a diagram schematically showing a configuration of a semiconductor memory device in accordance with the second embodiment of the present invention. FIG. 8 is a diagram showing a configuration of a sense latch portion and a memory mat in the semiconductor memory device in accordance with the second embodiment of the present invention.

Referring to FIG. 7 and FIG. 8, sense latch portions SLU0-SLU3 are arranged on the right side of memory mats M0_L-M3_L, buffer circuits BF0-BF3 are arranged on the right side of sense latch portions SLU0-SLU3, and memory mats M0_R-M3_R are arranged on the right side of buffer circuits BF0-BF3. In other words, memory mats M_R and M_L are arranged between sense latch portion SLU and buffer circuit BF.

Here, if the interconnection line between the sense amplifier and the input/output circuit is long, the data read time is increased due to the large wiring capacitance. In the semiconductor memory devices disclosed in Patent Documents 1-4, unfortunately, the increased data reading time resulting from data transfer between the sense amplifier and the input/output circuit cannot be prevented.

Especially in a semiconductor memory device having a memory cell storing multi-bit data, in data reading, different kinds of voltages are applied to a word line, and a sense amplifier detects a voltage variation in the global bit line according to each voltage and outputs binary data indicating the detection result to a buffer circuit. Then, the buffer circuit converts the binary data received from the sense amplifier into multi-value data for output to the outside. Therefore, when a memory cell stores multi-bit data, the number of times of data transfers between the sense amplifier and the buffer circuit becomes greater than the number of times of data transfers between the buffer circuit and the outside, so that the increase in data read time is outstanding.

However, in the semiconductor memory device in accordance with the second embodiment of the present invention, sense latch SL including a sense amplifier and buffer circuit BF are shared between memory mat M_L and memory mat M_R and are arranged between memory mat M_L and memory mat M_R. Such a configuration can prevent the increased data transfer time between the sense amplifier and the buffer circuit, which has a significant effect on the data read time as compared with the data transfer between the buffer circuit and the outside of the semiconductor memory device. Therefore, in the semiconductor memory device in accordance with the second embodiment of the present invention, it is possible to prevent an increase in access time, for example, data reading, to the semiconductor memory device.

It is noted that the semiconductor memory device in accordance with the first and second embodiments of the present invention may be applied to various kinds of memories including memories having NAND-type, NOR-type and AG-AND-type memory cell arrangements. It is more effective especially to the application to a memory such as SRAM requiring a high-speed operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a first memory mat and a second memory mat each including a memory cell storing data;
   at least one first current line arranged for each of said memory mats and connected to one conductive electrode of said memory cell;
   a sense latch shared between said memory mats, storing electric charges corresponding to write data for said memory cell in said first current line and detecting data stored by said memory cell based on a voltage value or a current value of said first current line;
   at least one second current line arranged for each of said memory mats;

a plurality of first transistors arranged corresponding to said first current line for switching between connection and disconnection between said first current line and said second current line;

a plurality of second transistors arranged corresponding to said first current line for switching between connection and disconnection between said first current line and said sense latch;

at least one third current line arranged for each of said memory mats; and a plurality of third transistors arranged corresponding to said first current line for switching between connection and disconnection between the other conductive electrode of said memory cell and said third current line, wherein said first memory mat, a drain region, a gate region and a source region of said first transistor corresponding to said first memory mat, said sense latch, a drain region, a gate region and a source region of said first transistor corresponding to said second memory mat, and said second memory mat are arranged in that order in a direction in which said first current line extends.

2. The semiconductor memory device according to claim 1, further comprising:

a voltage generation circuit supplying voltage to said each transistor; and a control circuit controlling said sense latch and said voltage generation circuit such that in data reading from said memory cell of said each memory mat, said first transistor corresponding to said each memory mat is activated to connect said first current line and said second current line, and thereafter said third transistor corresponding to said each memory mat is activated to connect the other conductive electrode of said memory cell and said third current line, and thereafter said second transistor corresponding to any one of said memory mats is successively activated and said second transistor of another said memory mat is inactivated thereby to successively detect storage data of said memory cell connected to said first current line corresponding to said activated second transistor, based on a voltage value or a current value of said first current line corresponding to said activated second transistor.

3. The semiconductor memory device according to claim 1, further comprising:

a voltage generation circuit supplying voltage to said each transistor; and a control circuit according said sense latch and said voltage generation circuit such that in data writing to said memory cell of said each memory mat, said second transistor corresponding to any one of said memory mats is successively activated and said second transistor of another said memory mat is inactivated, and electric charges corresponding to said write data are stored in said first current line connected to said activated second transistor and thereafter said third transistor corresponding to said each memory mat is activated to connect the other conductive electrode of said memory cell and said third current line.

4. A semiconductor memory device comprising:

a first memory mat and a second memory mat each including a memory cell storing data;

at least one first current line arranged for each of said memory mats and connected to one conductive electrode of said memory cell;

a sense latch shared between said memory mats, storing electric charges corresponding to write data for said memory cell in said first current line and detecting data stored by said memory cell based on a voltage value or a current value of said first current line;

at least one second current line arranged for each of said memory mats;

a plurality of first transistors arranged corresponding to said first current line for switching between connection and disconnection between said first current line and said second current line;

a plurality of second transistors arranged corresponding to said first current line for switching between connection and disconnection between said first current line and said sense latch;

at least one third current line arranged for each of said memory mats; and a plurality of third transistors arranged corresponding to said first current line for switching between connection and disconnection between the other conductive electrode of said memory cell and said third current line, wherein a fourth transistor and a fifth transistor are arranged between said sense latch and said first memory mat, and a source region of said fourth transistor and said fifth transistor is formed in common, a sixth transistor and a seventh transistor are arranged between said sense latch and said second memory mat, and a source region of said sixth transistor and said seventh transistor is formed in common, said first memory mat, a drain region and a gate region of said fourth transistor, the source region of said fourth transistor and said fifth transistor, a gate region and a drain region of said fifth transistor, said sense latch, a drain region and a gate region of said sixth transistor, the source region of said sixth transistor and said seventh transistor, a gate region and a drain region of said seventh transistor, and said second memory mat are arranged in that order in a direction in which said first current line extends, and said fourth transistor is used as said first transistor corresponding to said first memory mat, and said sixth transistor is used as first transistor corresponding to said second memory mat.

5. The semiconductor memory device according to claim 4, further comprising:

a voltage generation circuit supplying voltage to said each transistor; and a control circuit controlling said sense latch and said voltage generation circuit such that in data reading from said memory cell of said each memory mat, said first transistor corresponding to said each memory mat is activated to connect said first current line and said second current line, and thereafter said third transistor corresponding to said each memory mat is activated to connect the other conductive electrode of said memory cell and said third current line, and thereafter said second transistor corresponding to any one of said memory mats is successively activated and said second transistor of another said memory mat is inactivated thereby to successively detect storage data of said memory cell connected to said first current line corresponding to said activated second transistor, based on a voltage value or a current value of said first current line corresponding to said activated second transistor.

6. The semiconductor memory device according to claim 4, further comprising:
- a voltage generation circuit supplying voltage to said each transistor; and
- a control circuit according said sense latch and said voltage generation circuit such that
- in data writing to said memory cell of said each memory mat, said second transistor corresponding to any one of said memory mats is successively activated and said second transistor of another said memory mat is inactivated, and electric charges corresponding to said write data are stored in said first current line connected to said activated second transistor and thereafter said third transistor corresponding to said each memory mat is activated to connect the other conductive electrode of said memory cell and said third current line.

* * * * *